(12) United States Patent
Karpas et al.

(10) Patent No.: US 9,102,099 B1
(45) Date of Patent: Aug. 11, 2015

(54) METHODS FOR ADDITIVE MANUFACTURING PROCESSES INCORPORATING ACTIVE DEPOSITION

(71) Applicant: MetaMason, Inc., Pasadena, CA (US)

(72) Inventors: Leslie Oliver Karpas, Pasadena, CA (US); Aaron M. Ryan, Los Angeles, CA (US)

(73) Assignee: MetaMason, Inc., Pasadena, CA (US)

( * ) Notice: Subject to any disclaimer, the term of this patent is extended or adjusted under 35 U.S.C. 154(b) by 0 days.

(21) Appl. No.: 14/321,046

(22) Filed: Jul. 1, 2014

Related U.S. Application Data

(60) Provisional application No. 61/936,263, filed on Feb. 5, 2014.

(51) Int. Cl.
*B29C 41/02* (2006.01)
*B29C 67/00* (2006.01)

(52) U.S. Cl.
CPC ......... *B29C 67/0085* (2013.01); *B29C 67/0051* (2013.01); *B29C 67/0055* (2013.01); *B29C 67/0059* (2013.01)

(58) Field of Classification Search
CPC ........ B29B 13/00; B29B 13/02; B29B 13/08; B29C 67/005; B29C 67/0055; B29C 67/0051; B29C 67/0059
USPC ............. 264/69, 83, 85, 167, 172.12, 172.13, 264/172.14, 172.15, 177.13, 294, 308, 405, 264/427, 442
See application file for complete search history.

(56) References Cited

U.S. PATENT DOCUMENTS

| 5,059,266 A | 10/1991 | Yamane et al. |
| 6,143,378 A * | 11/2000 | Harwell et al. ............... 427/597 |

(Continued)

FOREIGN PATENT DOCUMENTS

| EP | 2514775 A1 | 10/2012 |
| WO | 0009307 | 2/2000 |

(Continued)

OTHER PUBLICATIONS

"3D printing parts with overhanfs using new soluble support material", 3D printer and 3D printing news, Feb. 28, 2013, 3 pgs.

(Continued)

*Primary Examiner* — Leo B Tentoni
(74) *Attorney, Agent, or Firm* — KPPB LLP

(57) ABSTRACT

Systems and methods in accordance with embodiments of the invention implement additive manufacturing processes whereby the constituent material of an object to be fabricated is manipulated prior to, or during, the respective deposition process such that different portions of the deposited constituent material can be made to possess different material properties. In one embodiment, an additive manufacturing apparatus includes: a nozzle configured to accommodate the extrusion of a constituent material through it and deposit the constituent material onto a surface in accordance with an additive manufacturing process to build up an object to be fabricated; and a subassembly configured to manipulate the material properties of some portion of the constituent material such that different portions of the deposited constituent material can be made to possess different material properties; where the subassembly is configured to begin said manipulation prior to, or concurrently with, its deposition onto a surface.

11 Claims, 17 Drawing Sheets

(56) References Cited

U.S. PATENT DOCUMENTS

| | | |
|---|---|---|
| 6,375,880 B1 | 4/2002 | Cooper et al. |
| 6,790,403 B1 | 9/2004 | Priedeman, Jr. et al. |
| 7,087,200 B2 | 8/2006 | Taboas et al. |
| 7,168,935 B1 * | 1/2007 | Taminger et al. ......... 264/405 X |
| 8,246,888 B2 | 8/2012 | Hopkins et al. |
| 8,459,280 B2 | 6/2013 | Swanson et al. |
| 8,460,755 B2 | 6/2013 | Rodgers |
| 2006/0175034 A1 | 8/2006 | Okhuysen-Caredenas et al. |
| 2008/0110869 A1 | 5/2008 | Chen |
| 2010/0181706 A1 | 7/2010 | Ruuttu et al. |
| 2010/0270274 A1 * | 10/2010 | Taminger et al. ........ 219/121.17 |
| 2011/0076495 A1 * | 3/2011 | Batchelder et al. ............ 428/369 |
| 2011/0203937 A1 | 8/2011 | Sidhu et al. |
| 2013/0011624 A1 | 1/2013 | Takenaka |
| 2013/0215197 A1 | 8/2013 | Hays et al. |
| 2013/0241114 A1 | 9/2013 | Ravich et al. |
| 2014/0061974 A1 * | 3/2014 | Tyler ............................ 264/401 |
| 2015/0035200 A1 | 2/2015 | Karpas et al. |

FOREIGN PATENT DOCUMENTS

| | | |
|---|---|---|
| WO | 03089215 | 10/2003 |
| WO | 2006020279 A2 | 2/2006 |
| WO | 2013126981 A1 | 9/2013 |
| WO | 2015017829 A2 | 2/2015 |
| WO | 2015017829 A8 | 3/2015 |

OTHER PUBLICATIONS

"RTV Molding With PolyJet or FDM Patterns", Stratasys for a 3D World, 3 pgs, (2013).

Frick, "How to 3D Print Plastic Molds and Tooling", Machine Design, 7 pgs.

International Search Report and Written Opinion for International Application PCT/US2014/049481, completed Oct. 10, 2014, 9 pgs.

International Search Report and Written Opinion PCT/US2015/014689, Search Completed Mar. 31, 2015, Mailed Apr. 21, 2015, 10 Pgs.

* cited by examiner

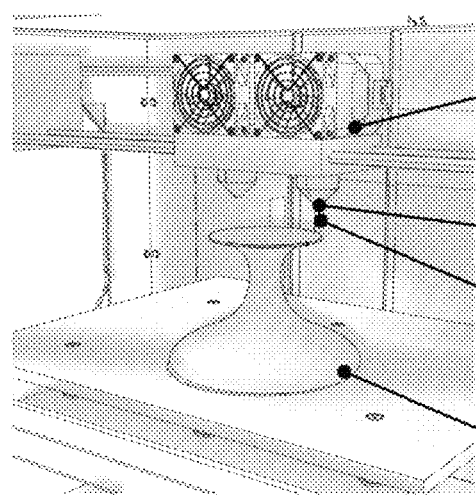
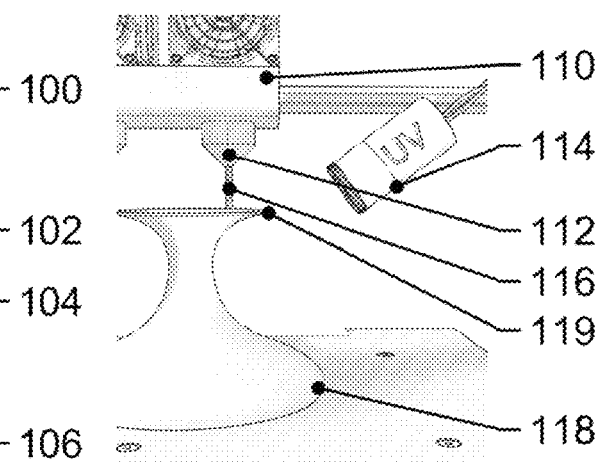
FIG. 1A
(Prior Art)
FIG. 1B
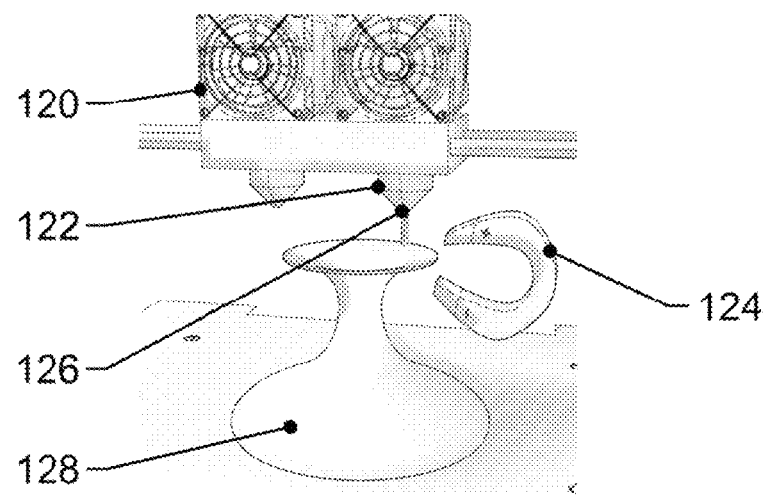
FIG. 1C

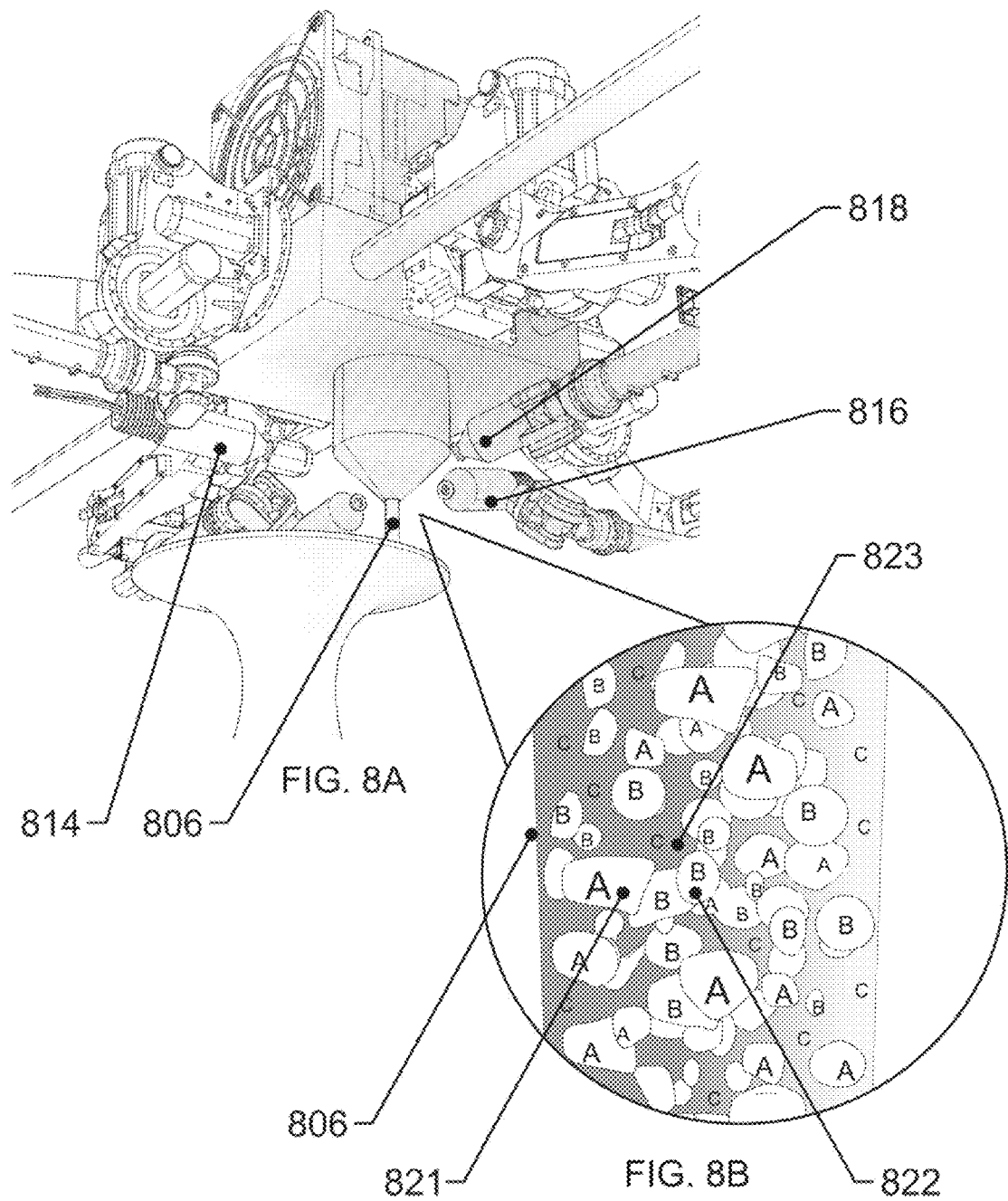

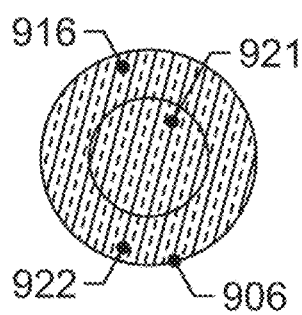 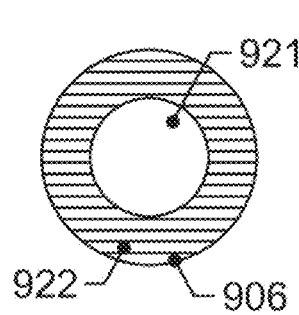 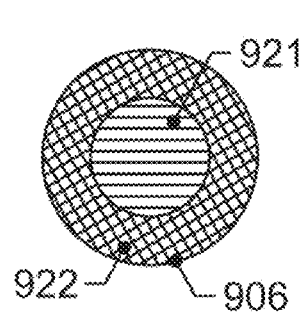
FIG. 9A        FIG. 9B        FIG. 9C
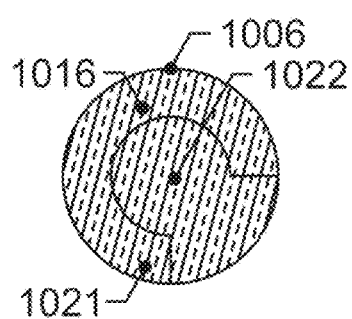 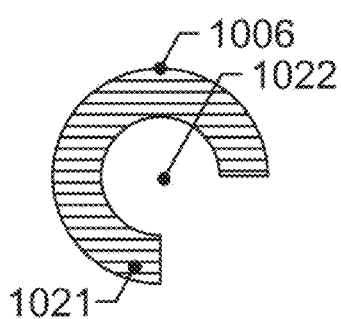 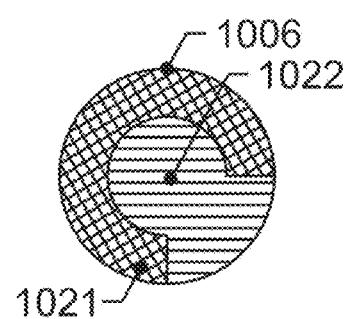
FIG. 10A       FIG. 10B       FIG. 10C

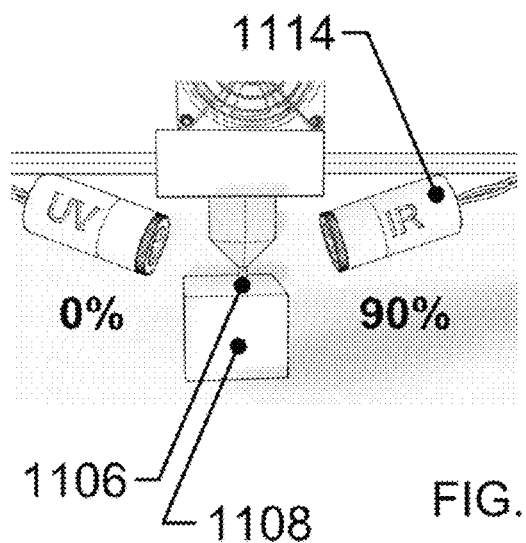 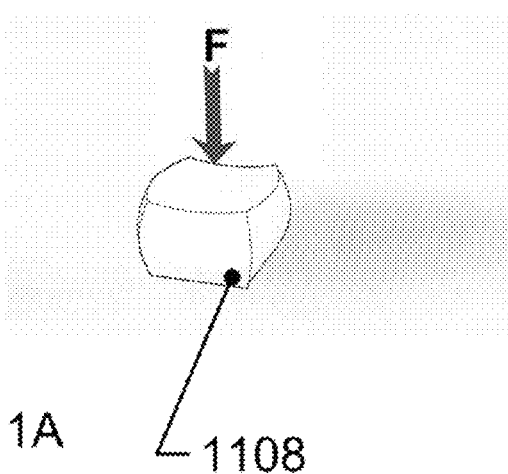
FIG. 11A
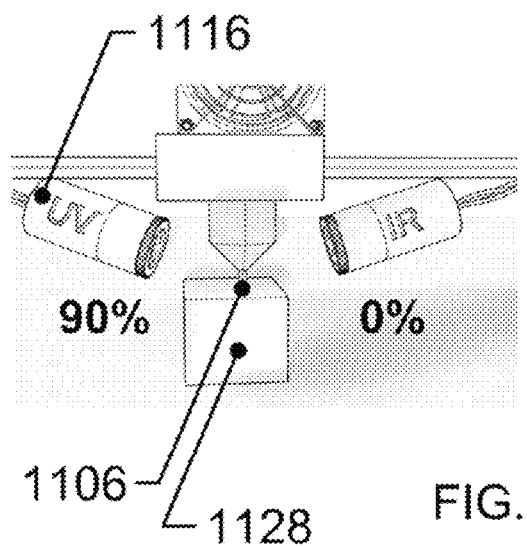 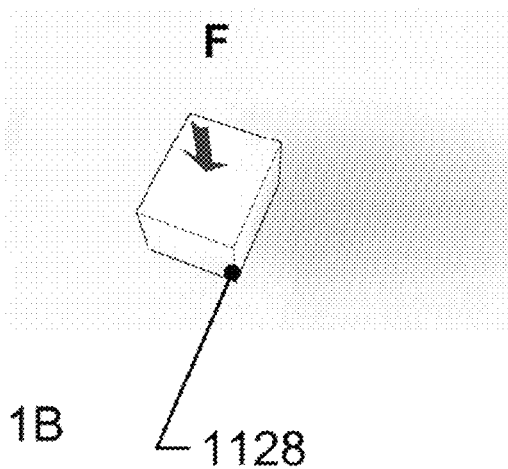
FIG. 11B
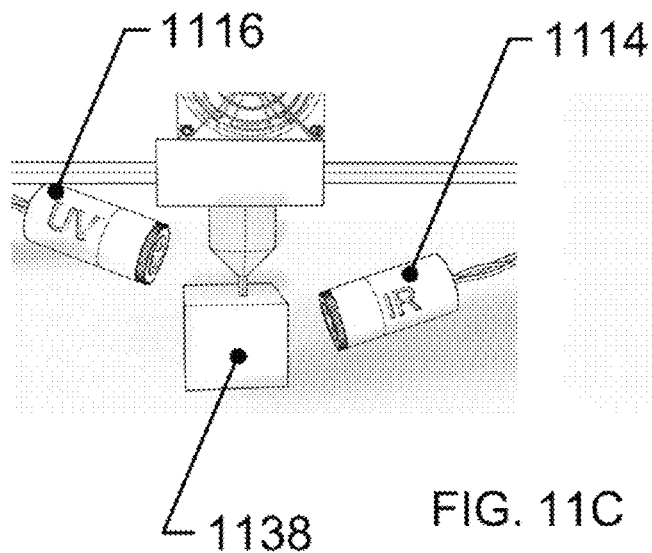 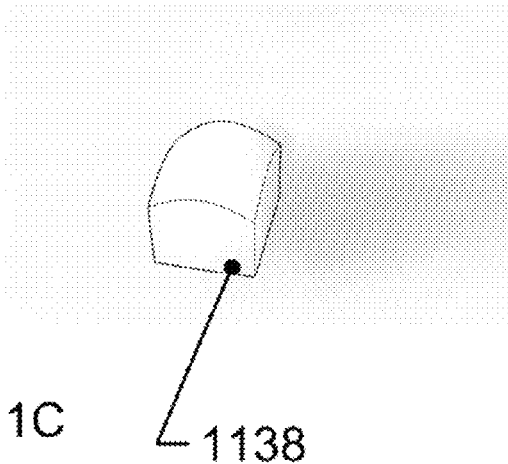
FIG. 11C

METHODS FOR ADDITIVE MANUFACTURING PROCESSES INCORPORATING ACTIVE DEPOSITION

CROSS-REFERENCE TO RELATED APPLICATIONS

The current application claims priority to U.S. Provisional Patent Application No. 61/936,263, filed Feb. 5, 2014, the disclosure of which is hereby incorporated by reference.

FIELD OF THE INVENTION

The present invention generally relates to additive manufacturing apparatuses and techniques for additive manufacturing.

BACKGROUND

'Additive manufacturing,' or '3D Printing,' is a term that typically describes a manufacturing process whereby a 3D model of an object to be fabricated is provided to an apparatus (e.g. a 3D printer), which then autonomously fabricates the object by gradually depositing, or otherwise forming, the constituent material in the shape of the object to be fabricated. For example, in many instances, successive layers of material that represent cross-sections of the object are deposited or otherwise formed; generally, the deposited layers of material fuse (or otherwise solidify) to form the final object. Because of their relative versatility, additive manufacturing techniques have generated much interest.

SUMMARY OF THE INVENTION

Systems and methods in accordance with embodiments of the invention implement additive manufacturing processes whereby the constituent material of an object to be fabricated is actively manipulated prior to, or during, the deposition process such that different portions of the deposited constituent material can be made to possess different material properties. In one embodiment, an additive manufacturing apparatus includes: a nozzle configured to accommodate the extrusion of a constituent material through the nozzle and deposit the constituent material onto a surface in accordance with an additive manufacturing process to build up an object to be fabricated; and at least one subassembly configured to manipulate the material properties of at least some portion of the constituent material such that different portions of the deposited constituent material can be made to possess different material properties; where the at least one subassembly is configured to begin the manipulation of the material properties of the at least some portion of the constituent material prior to, or concurrently with, its deposition onto a surface.

In another embodiment, the subassembly is configured to begin the manipulation of the material properties of the at least some portion of the constituent material after it is extruded through the nozzle.

In still another embodiment, the subassembly includes at least one of: an electromagnetic wave source configured to subject at least some portion of the constituent material to electromagnetic waves to begin the manipulation of its material properties; a magnetizing source configured to begin the magnetization of the at least some portion of the constituent material; a source of gas configured to subject the at least some portion of the constituent material to the gas that begins the manipulation of its material properties; a vibrating apparatus configured to vibrate the at least some portion of the constituent material to thereby begin the manipulation of its material properties; and a heating source configured to heat the at least some portion of the constituent material to thereby begin the manipulation of its material properties.

In yet another embodiment, the additive manufacturing apparatus further includes a spatial-orientation mechanism configured to orient the subassembly relative to the nozzle.

In still yet another embodiment, the subassembly includes at least one electromagnetic wave source.

In a further embodiment, the electromagnetic wave source is coupled to the nozzle.

In a still further embodiment, the electromagnetic wave source is independent of the nozzle, such that the nozzle can move independently of the electromagnetic wave source during the buildup of an object to be fabricated.

In a yet further embodiment, the subassembly further includes fiber optic cables configured to transmit electromagnetic waves generated by the electromagnetic wave source to constituent material that is extruded through the nozzle.

In a still yet further embodiment, the subassembly further includes optics for focusing electromagnetic waves generated by the electromagnetic wave source onto constituent material that is extruded through the nozzle.

In another embodiment, the at least one subassembly is at least two subassemblies.

In still another embodiment, the at least two subassemblies are disposed about the perimeter of the nozzle, and each of the at least two subassemblies is configured to begin the manipulation of the material properties in the same manner on different respective portions of constituent material that is extruded through the nozzle.

In yet another embodiment, each of the subassemblies is configured to begin the manipulation of the material properties on constituent material that is extruded through the nozzle in a manner differently than the other respective subassembly.

In still yet another embodiment, the nozzle is configured to accommodate the extrusion of a constituent material that includes at least two component materials, and the subassembly is configured to begin the manipulation of the material properties of at least some portion of the constituent material by manipulating the composition of the cross-section of the constituent material as it is extruded through the nozzle.

In a further embodiment, the subassembly is configured to manipulate the spatial positioning of a first component material relative to a second component material within a given cross-section of the constituent material as it is deposited on a surface.

In a still further embodiment, the subassembly includes a channel that is configured to transmit the first component material for aggregation with the second component material to form the constituent material.

In a yet further embodiment, the subassembly is configured to cause the aggregation of the first component material and the second component material prior to, or at the time of, the extrusion of the constituent material through the nozzle.

In a still yet further embodiment, the additive manufacturing apparatus further includes a spatial orienting mechanism configured to spatially orient the channel to thereby control the aggregation of the first component material and the second component material.

In another embodiment, the additive manufacturing apparatus further includes at least a second channel disposed proximate the first channel and configured to transmit the second component material, and a rotating mechanism for translating the first channel and second channel in a circular path such that the respective component materials that outflow from the respective channels can be controllably intertwined to thereby form the constituent material.

In still another embodiment, the subassembly includes a shutter assembly configured to control the dimensions of the cross-section of constituent material that is extruded through the nozzle.

In a further embodiment, a method of fabricating an object includes: progressively depositing constituent material onto a surface to form the shape of the object to be fabricated in accordance with an additive manufacturing process; and manipulating the material properties of at least some portion of the constituent material that is deposited onto a surface such that at least some portion of the deposited constituent material possesses different material properties than at least some other portion of the deposited constituent material; where manipulating the material properties of the at least some portion of the constituent material begins prior to, or concurrently with, its deposition onto a surface.

In a still further embodiment, progressively depositing the constituent material onto a surface includes extruding the constituent material through a nozzle, and manipulating the material properties of the at least some portion of the constituent material begins after the at least some portion of the constituent material is extruded through the nozzle.

In a yet further embodiment, manipulating the material properties of the at least some portion of the constituent material includes one of: subjecting the at least some portion of the constituent material to electromagnetic waves; magnetizing the at least some portion of the constituent material; subjecting the at least some portion of the constituent material to a gas; vibrating the at least some portion of the constituent material; and heating the at least some portion of the constituent material.

In a still yet further embodiment, manipulating the material properties of the at least some portion of the constituent material includes subjecting the at least some portion of the constituent material to electromagnetic waves.

In another embodiment, subjecting the at least some portion of the constituent material to electromagnetic waves includes using fiber optic cables to transmit the electromagnetic waves from a wave source to the at least some portion of the constituent material.

In still another embodiment, subjecting the at least some portion of the constituent material to electromagnetic waves includes using optics to focus the electromagnetic waves onto the at least some portion of the constituent material.

In yet another embodiment, the method of fabricating an object further includes manipulating the material properties of at least some portion of the constituent material that is deposited onto a surface in at least another way.

In still yet another embodiment, the constituent material includes at least two component materials; and manipulating the material properties of the at least some portion of the constituent material includes manipulating the composition of the cross-section of the constituent material that is deposited onto a surface.

In a further embodiment, manipulating the composition of the cross-section of the constituent material that is deposited onto a surface includes varying the aggregation of a first component material and at least a second component material.

In a still further embodiment, varying the aggregation of a first component material and at least a second component material includes intertwining the first component material and at least the second component material as the constituent material is being deposited onto a surface.

In a yet further embodiment, manipulating the material properties of the at least some portion of the constituent material includes varying the cross-section of the constituent material that is deposited.

BRIEF DESCRIPTION OF THE DRAWINGS

FIGS. 1A-1C illustrate the advantages, relative to the prior art, of treating a material as it is extruded in an additive manufacturing process in accordance with embodiments of the invention.

FIGS. 8A-8B illustrates an additive manufacturing apparatus including multiple subassemblies, each configured to treat the constituent material in a unique way, in accordance with an embodiment of the invention.

FIGS. 9A-9C illustrate a constituent material that includes two aspects being uniformly subjected to a treatment that impacts each aspect differently in accordance with embodiments of the invention.

FIGS. 10A-10C illustrate a constituent material that includes two aspects that define a C-shape being uniformly subjected to a treatment that impacts each aspect differently in accordance with embodiments of the invention FIGS. 11A-11C illustrate implementing different treating methods to customize the material properties of an object to be fabricated in accordance with embodiments of the invention.

DETAILED DESCRIPTION

Figure 2:
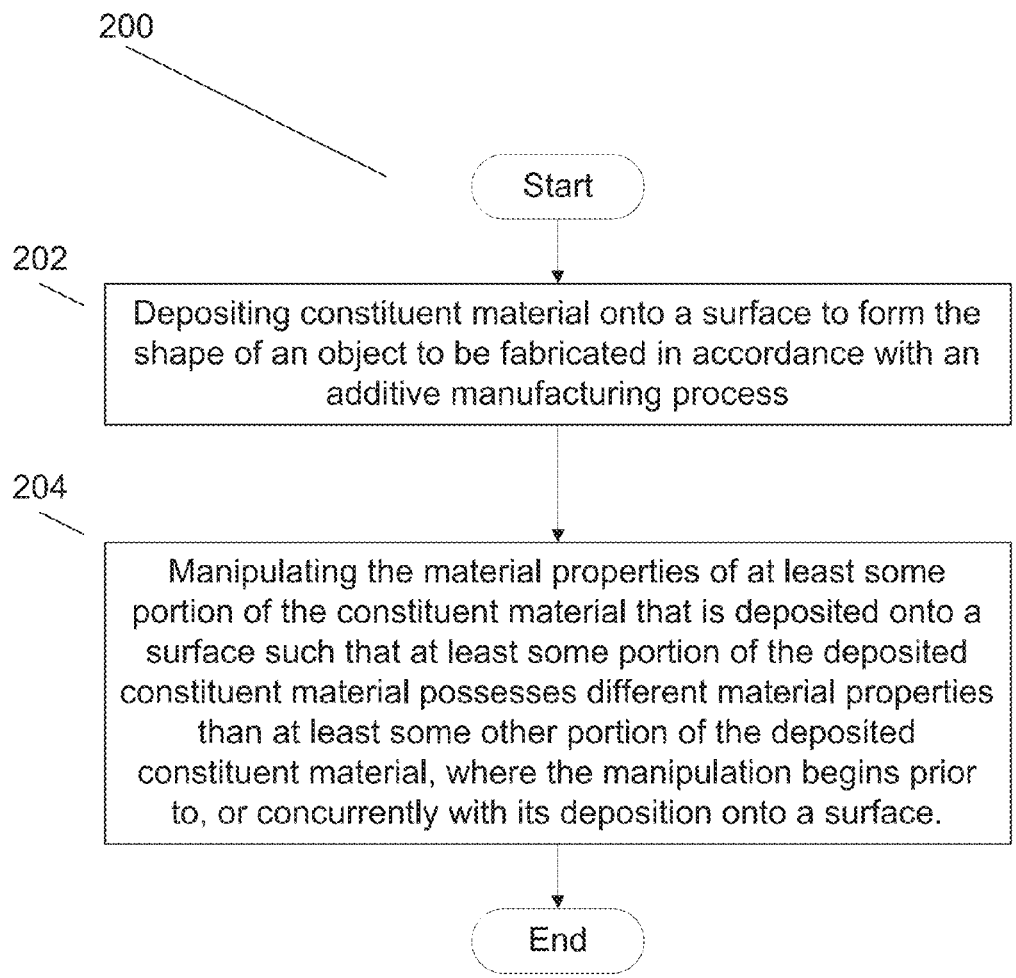
FIG. 2 illustrates a method of additively manufacturing an object where constituent material is manipulated in the deposition process in accordance with an embodiment of the invention.

Turning now to the drawings, systems and methods for implementing additive manufacturing processes incorporating active deposition are illustrated. In many embodiments, a method of additively manufacturing an object includes manipulating the material properties of at least some portion of the constituent material that is deposited in accordance with an additive manufacturing process to form the object such that at least some portion of the deposited constituent material possesses different material properties than at least some other portion of the deposited constituent material, where manipulation of the material properties of the at least some portion of the constituent material begins prior to, or concurrently with its deposition onto a surface. In numerous embodiments, the method includes beginning the manipulation of the at least some portion of the constituent material after it has been extruded through the nozzle of an additive manufacturing apparatus. In several embodiments, electromagnetic waves are used to begin the manipulation of the at least some portion of the constituent material. In a number of embodiments, certain portions of the constituent material are manipulated in one way and certain portions of the constituent material are manipulated in another way. In many embodiments, the composition of the cross-section of the constituent material is manipulated prior to the deposition of at least some portion of the constituent material onto a surface. In many embodiments, the aggregation of two component materials to form the constituent material is controlled such that the composition of portions of the constituent material can be varied.

Since its inception, additive manufacturing, or '3D Printing', has generated much interest from manufacturing communities because of the seemingly unlimited potential that these fabrication techniques can offer. For example, these techniques have been demonstrated to produce any of a variety of distinct and intricate geometries, with the only input being the final shape of the object to be formed. In many instances, a 3D rendering of an object is provided electronically to a '3D Printer', which then fabricates the object. Many times, a 3D Printer is provided with a CAD File, a 3D Model, or instructions (e.g. via G-code), and the 3D Printer thereby fabricates the object. Importantly, as can be inferred, these processing techniques can be used to avoid heritage manufacturing techniques that can be far more resource intensive and inefficient. The relative simplicity and versatility of this process can pragmatically be used in any of a variety of scenarios including for example to allow for rapid prototyping and/or to fabricate components that are highly customized for particular consumers. For example, shoes that are specifically adapted to fit a particular individual can be additively manufactured. Indeed, U.S. Provisional Patent Application No. 61/861,376 discloses the manufacture of customized medical devices and apparel using additive manufacturing techniques; U.S. Provisional Patent Application No. 61/861,376 and its progeny are hereby incorporated by reference. It should also be mentioned that the cost of 3D printers has recently noticeably decreased, thereby making additive manufacturing processes an even more viable fabrication methodology.

Given the demonstrated efficacy and versatility of additive manufacturing processes, their potential continues to be explored. For example, while the operation of many current generation additive manufacturing apparatuses is premised on the uniform deposition of a material in the shape of the desired object such that the material properties of the corresponding printed object are largely homogenous throughout its structure, in many instances it may be desirable to additively manufacture a multi-material object. Accordingly, additive manufacturing apparatuses and techniques have recently been developed that can selectively deposit any of a plurality of different materials during the buildup of a desired object such that the printed object can be made up of a plurality of different materials. For example, Stratasys is a 3D Printing Company that develops 3D printers that can deposit any of a plurality of materials during the buildup of a single printed object, i.e. the printed object can be printed to include a plurality of distinct materials. For instance, the Objet Connex line of printers developed by Stratasys is adept at such 'multi-material printing.' Incidentally, Stratasys also boasts of its PolyJet Technology which allows 3D printing resolutions as fine as 0.0006" per layer of deposited material to be achieved. PolyJet technology essentially involves depositing a plurality of drops of liquid photopolymer onto a build tray, and instantly uniformly curing the deposited drops with UV light.

Nonetheless, even with these laudable achievements, the state of the art can further benefit from an ability to exercise even greater control and customization during the build of an object in accordance with an additive manufacturing process. Accordingly, in many embodiments of the invention additive manufacturing processes are implemented whereby the material properties of the constituent material of an additively manufactured object are controllably manipulated while the material is being deposited. In the context of this application, the constituent material can be understood to be the material that forms the additively manufactured object. Thus, material that is deposited in accordance with an additive manufacturing process can become the constituent material of the additively manufactured object. Hence, by controllably manipulating the material properties of the constituent material while it is being deposited, different portions of the additively manufactured object can be made to possess different material properties and additively manufactured objects can thereby be highly customized. For example, in many embodiments, the material properties of the constituent material are controlled by altering the constitution of the constituent material. These processes are now discussed in greater detail below.

Methods for Implementing Active Deposition in Additive Manufacturing Processes

In many embodiments, additive manufacturing processes that incorporate active deposition techniques are implemented. Active deposition can be understood to regard actively controlling the material properties of material that is deposited in conjunction with an additive manufacturing process to build up an object such that different portions of the additively manufactured structure can be made to possess different material properties. Such techniques can be extremely advantageous insofar as they can allow the fabrication of highly customized structures, e.g. different portions of the structure can have tailored material properties. Additionally, active deposition techniques can also impact the buildup of an object. For example, constituent material can be treated as it is being deposited so that it rapidly becomes sufficiently rigid such that the weight of an overhang portion will not distort its geometry.

FIGS. 1A-1C depict some of the advantages that active deposition techniques in accordance with embodiments of the invention can confer in relation to prior art additive manufacturing methods. In particular, FIG. 1A depicts the operation of a conventional additive manufacturing apparatus 100 that includes a nozzle head 102 that is seen depositing constituent material 104 to build up an object 106. FIG. 1B depicts an additive manufacturing apparatus 110 in accordance with embodiments of the invention that includes a nozzle head 112 and an ultraviolet (UV) electromagnetic wave source 114 that is configured to treat material that is extruded through the nozzle head 112. The apparatus is seen depositing material 116 to build up an object 118. Note that the object includes a relatively larger overhang feature 119 than anything seen with respect to FIG. 1A—the additive manufacture of this feature 119 is made possible as the UV electromagnetic wave source 114 can rapidly cure the material 116 as it is being deposited, such that the deposited material 116 is relatively more rigid so that its weight doesn't distort the desired overhang geometry 119. Essentially, the constituent material 116 is sensitive to UV electromagnetic wave exposure such that UV electromagnetic waves initiate the rapid hardening of the constituent material.

FIG. 1C depicts yet another advantage that can be realized with active deposition techniques. In particular, FIG. 1C depicts an additive manufacturing apparatus 120 in accordance with embodiments of the invention that includes a nozzle head 122 and a magnetizing source 124. The apparatus 120 is seen depositing material 126 to build up an object 128. Notably, the magnetizing source 124 can selectively impart magnetic polarities onto the additively manufactured object 128. In this way, the fabricated object can be highly customized, as it can be specifically determined which regions of the fabricated object are to possess magnetic properties, and to what extent.

The above-described non-limiting examples illustrate some of the advantages that the incorporation of active deposition in additive manufacturing techniques can provide. In many embodiments, additive manufacturing processes include active deposition that is characterized by the selective treatment of certain of the constituent material that is deposited. FIG. 2 illustrates a method of additively manufacturing an object that includes selectively manipulating the material properties of the constituent material during its deposition in accordance with embodiments of the invention. In particular, the method 200 includes depositing 202 constituent material onto a surface to form the shape of an object to be fabricated in accordance with an additive manufacturing process. Constituent material can be deposited 202 in accordance with any of a variety of additive manufacturing processes. For example, in many embodiments, constituent material is deposited 202 in accordance with a fused deposition modeling additive manufacturing process. Fused deposition modeling essentially regards depositing constituent material, usually in the form of a plastic filament or a metallic wire, into the shape of the desired object. Typically, the constituent material is extruded through a nozzle and thereby deposited. In a number of embodiments, constituent material is deposited 202 in accordance with a laser engineered net shaping (LENS) process. In LENS additive manufacturing, a feedstock metallic powder is provided to a build head that heats and deposits the feedstock metal into the shape of the structure to be formed. In several embodiments, constituent material is deposited in accordance with an electron beam freeform fabrication (EBF$^3$) additive manufacturing process. EBF$^3$ additive manufacturing processes are similar to LENS additive manufacturing processes, except that the feedstock metal is in the form of wire, and an electron beam is typically used to heat the wire.

In numerous embodiments, material is deposited 202 in conjunction with a 6-axis 3d printing additive manufacturing process. Whereas conventional 3d printing processes typically employ a vertically oriented build head that causes the downward deposition of constituent material, 6-axis 3d printing processes employ a build head that has six degrees of freedom and can thereby cause the deposition of the constituent material in any of a variety of directions. As can be appreciated, 6-axis 3d printing processes are more versatile than conventional additive manufacturing processes.

The method 200 further includes manipulating 204 the material properties of at least some portion of the constituent material that is deposited onto a surface such that at least some portion of the deposited constituent material possesses different material properties than at least some other portion of the deposited constituent material, where the manipulation begins prior to, or concurrently with, its deposition onto a surface. The material properties can be manipulated 204 in any suitable way in accordance with embodiments of the invention. For instance, in some embodiments, as discussed above with respect to FIG. 1C, the magnetic properties of the constituent material are manipulated; in this way, certain portions of the deposited constituent material can have different magnetic properties relative to other portions of the deposited constituent material. Accordingly, the magnetic properties of the additively manufactured object can vary throughout the geometry of the object, and the magnetic properties can thereby be highly customized. For example, a screwdriver having a magnetic tip portion can be additively manufactured using the above described processes.

In a number of embodiments, manipulating 204 the material properties of the constituent material includes manipulating the cross section of the constituent material (e.g. the cross section being judged as it is deposited onto a surface) such that the deposited constituent material in one portion of the additively manufactured object embodies a different cross section than another portion. In general, the constituent material can be manipulated in any of a variety of ways in accordance with embodiments of the invention—embodiments of the invention are not limited to manipulating the magnetic properties or the cross section of the material.

Figure 3A:
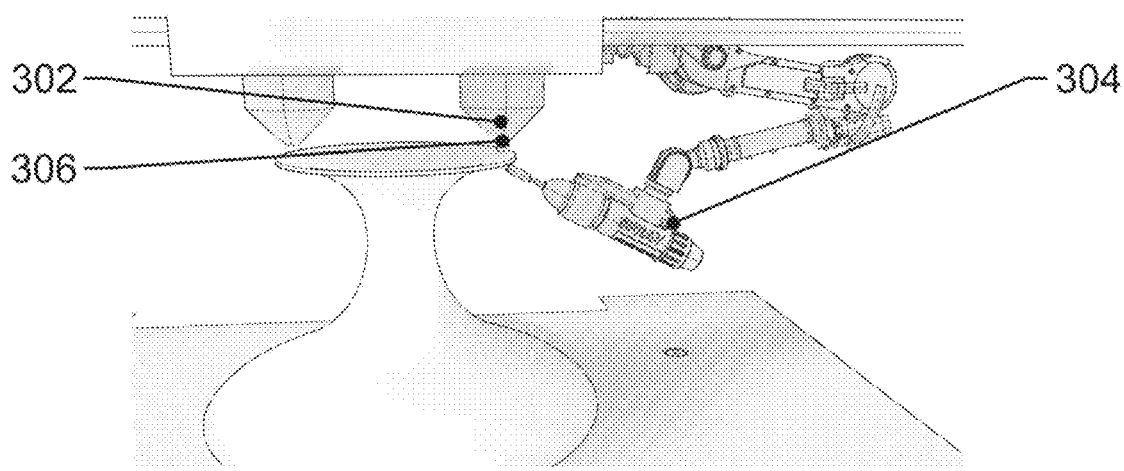
FIGS. 3A-3C illustrate various treating methods that can be imposed on materials as they are extruded in an additive manufacturing process in accordance with embodiments of the invention.
Figure 3B:
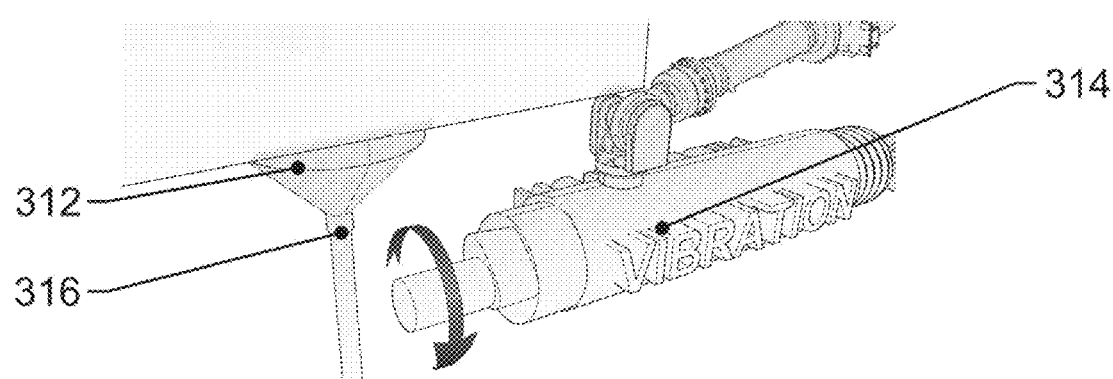
Figure 3C:
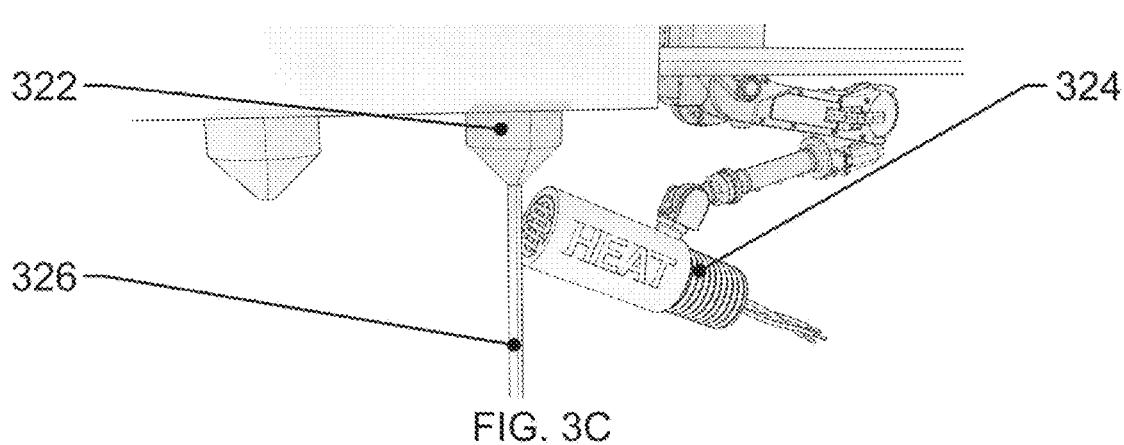

Moreover, any of a variety of techniques can be used to manipulate the material in accordance with embodiments of the invention. FIGS. 3A-3C depict some examples of techniques that can be used to manipulate the materials properties of the constituent material in accordance with embodiments of the invention. In particular, FIG. 3A depicts a portion of an additive manufacturing apparatus that includes a subassembly 304 that subjects constituent material 306, as it is extruded through the nozzle 302 during the deposition process, with a vapor that initiates a material transformation of the constituent material 306 as it is being deposited. Note that although the constituent material is being treated prior to its deposition onto the surface, the completion of any transformation may not happen until after the constituent material has been deposited. For example, the subassembly 304 might initiate a relatively slow reaction that does not complete until after the constituent material 306 has been deposited. While FIG. 3A depicts subjecting the constituent material 306 with a vapor, any similar process can be implemented in accordance with embodiments of the invention. For example, in some embodiments, a subassembly is configured to coat the constituent material (e.g. with color) as it is being deposited. The coating of the constituent material as it is being deposited adds a thin layer of material to the periphery of the constituent material and thereby alters the material properties of the constituent material. With this technique, different portions of the additively manufactured structure can be, for example, colored differently during the deposition process.

FIG. 3B depicts a portion of an additive manufacturing apparatus that includes a subassembly 314 that is configured to vibrate constituent material 316 as it is extruded through a nozzle 312. The vibration of the constituent material 316 can, for example, initiate work hardening that can alter the material properties of the constituent material 316.

Similarly, FIG. 3C depicts a portion of an additive manufacturing apparatus that includes a subassembly 324 that is configured to heat constituent material 326 as it exits a nozzle head 322. The heating, for example, can manipulate the material properties insofar as constituent material that is heated can be annealed.

Importantly, as can be appreciated, any combination of the above-described subassemblies can be incorporated to manipulate the material properties of the constituent material in accordance with embodiments of the invention. Indeed, more generally, any combination of any of a variety subassemblies that can manipulate the material properties of the constituent material in any of a variety of ways can be incorporated in accordance with embodiments of the invention. For example, in some embodiments, the deposited constituent material is manipulated by a subassembly that imposes a heat treatment on the constituent material, a subassembly that imposes an electromagnetic treatment on the constituent material, and/or a subassembly that imposes a magnetic treatment on the constituent material. In some embodiments, a single subassembly is capable of manipulating the constituent material in a plurality of ways. For example, in some embodiments, a single subassembly can impose a magnetic treatment, an electromagnetic treatment, and/or a heat treatment on the constituent material. In general, the constituent material can be manipulated in any number of ways in accordance with embodiments of the invention.

Figure 4:
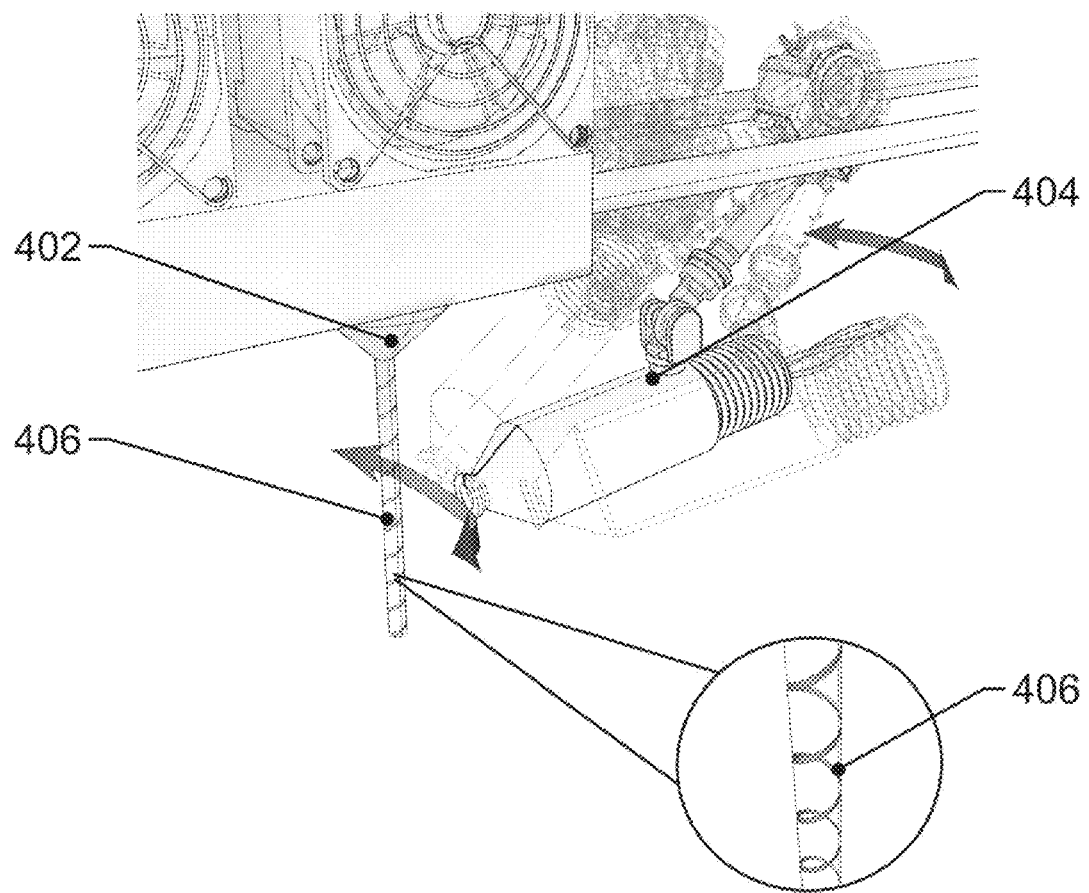
FIG. 4 illustrates an additive manufacturing apparatus that includes an assembly that is configured to manipulate the material properties of the constituent material, and is configured such that it can maneuver around the nozzle in accordance with an embodiment of the invention.

In a number of embodiments, additive manufacturing apparatuses that are configured to incorporate active deposition techniques include subassemblies that can be moved relative to the deposited constituent material. For example, in many embodiments, a subassembly can maneuver around and about constituent material as it is extruded through an additive manufacturing nozzle head. In this way, cylindrical portions of the extruded material, for example, do not have to be treated uniformly; instead, the subassembly can maneuver so as to treat only certain portions of the constituent material that is extruded onto a surface. FIG. 4 illustrates an additive manufacturing apparatus that includes a subassembly that can maneuver relative to constituent material that is extruded through a nozzle. In particular, the additive manufacturing apparatus includes a nozzle 402 and a subassembly 404 that can maneuver with respect to constituent material 406 that is extruded through the nozzle 402. As can be appreciated, the subassembly 404 can manipulate the properties of the constituent material 406 in any suitable way, including in any of the above-described ways, in accordance with embodiments of the invention. The illustration depicts that the subassembly 404 can maneuver with sufficient precision such that only certain portions 408 (as opposed to an entire portion of the extruded section) of the constituent material 406 have been treated. Thus, only those treated portions will possess the transformed material properties. In essence, the material properties of the constituent material can be custom-tailored with even greater precision.

Accordingly, it can be seen how the incorporation of active deposition techniques in accordance with embodiments of the invention can allow the manufacture of highly customized objects. While several techniques are shown for manipulating the material properties, it should be clear that the material can be manipulated in any suitable way in accordance with embodiments of the invention. In many embodiments, the manipulation of material properties is achieved by subjecting the constituent material to electromagnetic waves that initiate the transformation of the material properties, and this is now discussed in greater detail below.

Using Electromagnetic Waves to Initiate the Transformation of Material Properties In many embodiments, electromagnetic waves are used to initiate the transformation of materials properties of portions of the constituent material. For example, in numerous embodiments, either infrared rays or ultraviolet rays are used to initiate the transformation of materials properties of a constituent material as it is extruded through the nozzle. Of course, the constituent material can be exposed to any suitable electromagnetic waves that initiate the transformation of its material properties. As can be appreciated, the constituent material that is to be deposited must be sensitive to the particular applied electromagnetic wave, and the effect of the electromagnetic radiation exposure on the material properties should be known. For example, in some embodiments, the constituent material is exposed to electromagnetic radiation of a particular wavelength that alters the mechanical properties of the constituent material. In several embodiments, exposure to electromagnetic radiation of a particular wavelength alters the opacity of the material. For example, the constituent material can include a pigment that is sensitive to the applied electromagnetic radiation such that the opacity of the constituent material can be tuned. Of course, the constituent material can be sensitive to the application of electromagnetic radiation in any of a variety of ways, and this sensitivity can be utilized to controllably tune the material properties in accordance with embodiments of the invention.

Figure 5:
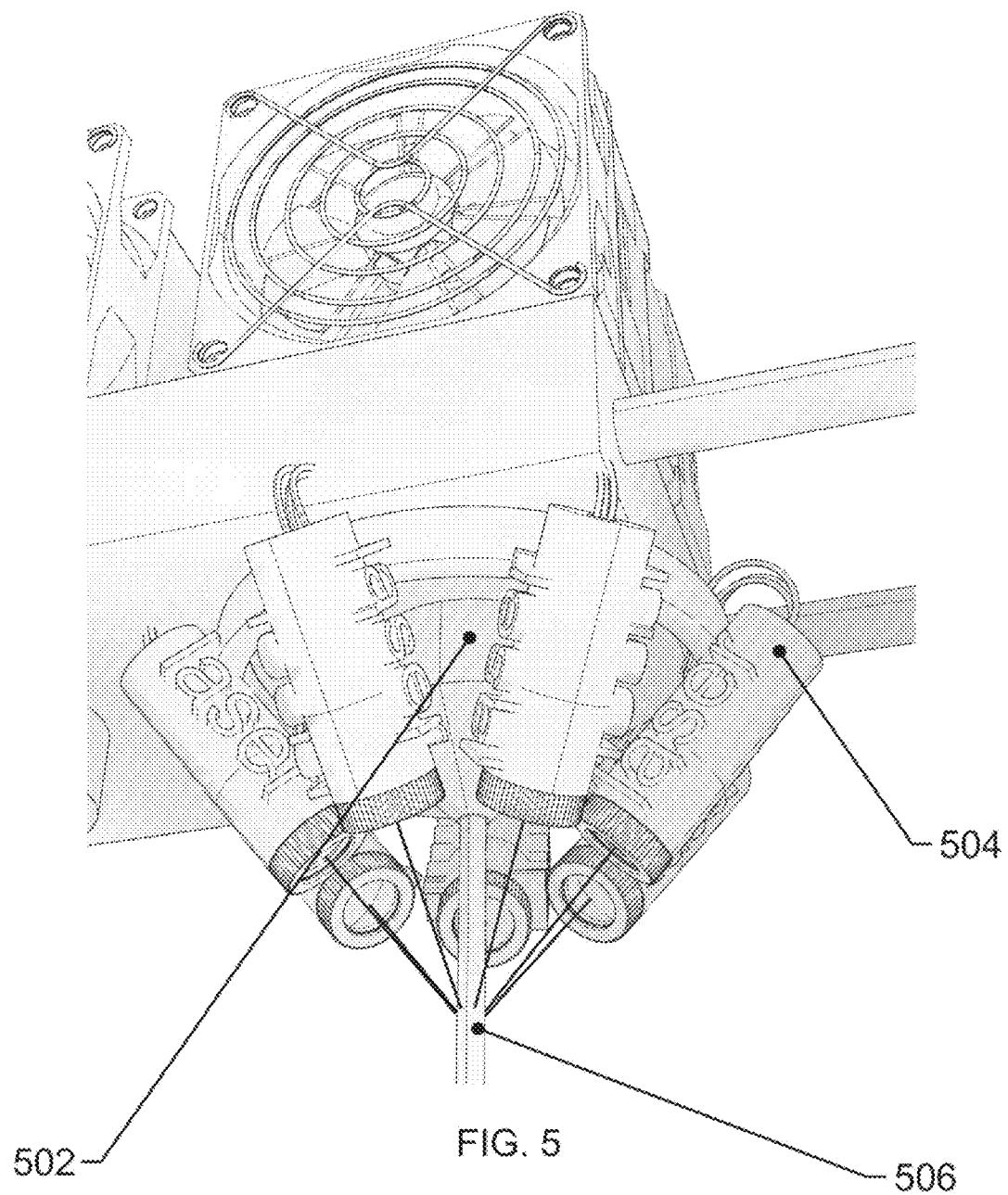
FIG. 5 illustrates an additive manufacturing apparatus including a polar array of subassemblies that include electromagnetic wave sources that can be used to manipulate the material properties of the constituent material in accordance with an embodiment of the invention.

FIG. 5 illustrates an additive manufacturing apparatus that includes subassemblies that are configure to irradiate constituent material as it is extruded through a nozzle, and thereby alter the constituent material, in accordance with embodiments of the invention. In particular, the additive manufacturing apparatus includes a plurality of subassemblies 504 that are symmetrically disposed about a nozzle 502; the plurality of subassemblies are configured to irradiate the constituent material with electromagnetic waves of a particular wavelength as it is extruded through the nozzle 502, and thereby initiate a material transformation. The symmetrical distribution of the subassemblies 506 around the perimeter of the deposited constituent material 506 allows selected portions of the deposited constituent material to be irradiated. As can be appreciated, the constituent material can be irradiated with electromagnetic waves of any suitable wavelength. For example, the constituent material can be irradiated with ultraviolet waves, infrared waves, X-ray waves, microwaves, etc.

Figure 6:
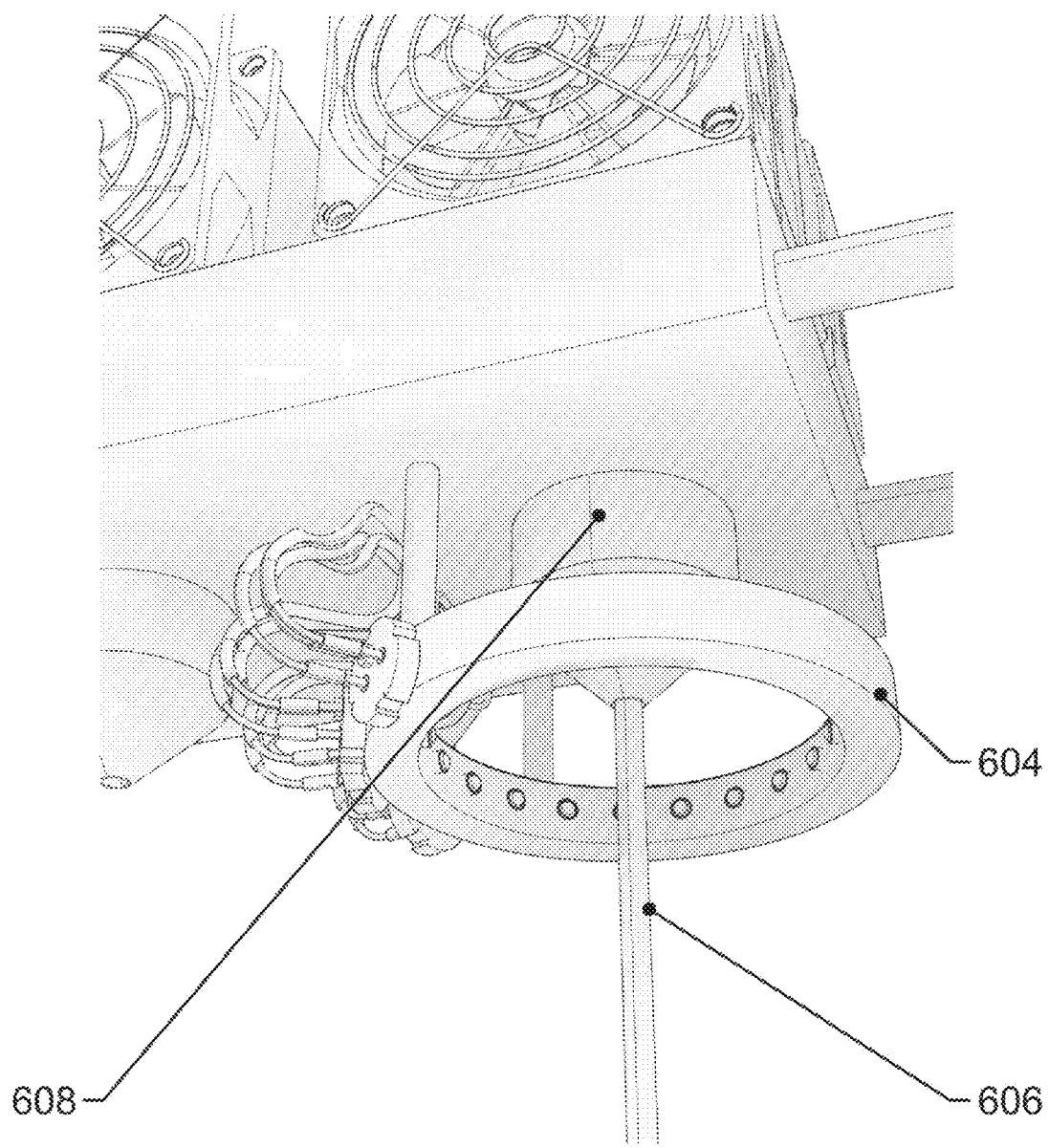
FIG. 6 illustrates using fiber optics to transmit electromagnetic waves to treat a material as it is extruded in accordance with an embodiment of the invention.
Figure 7:
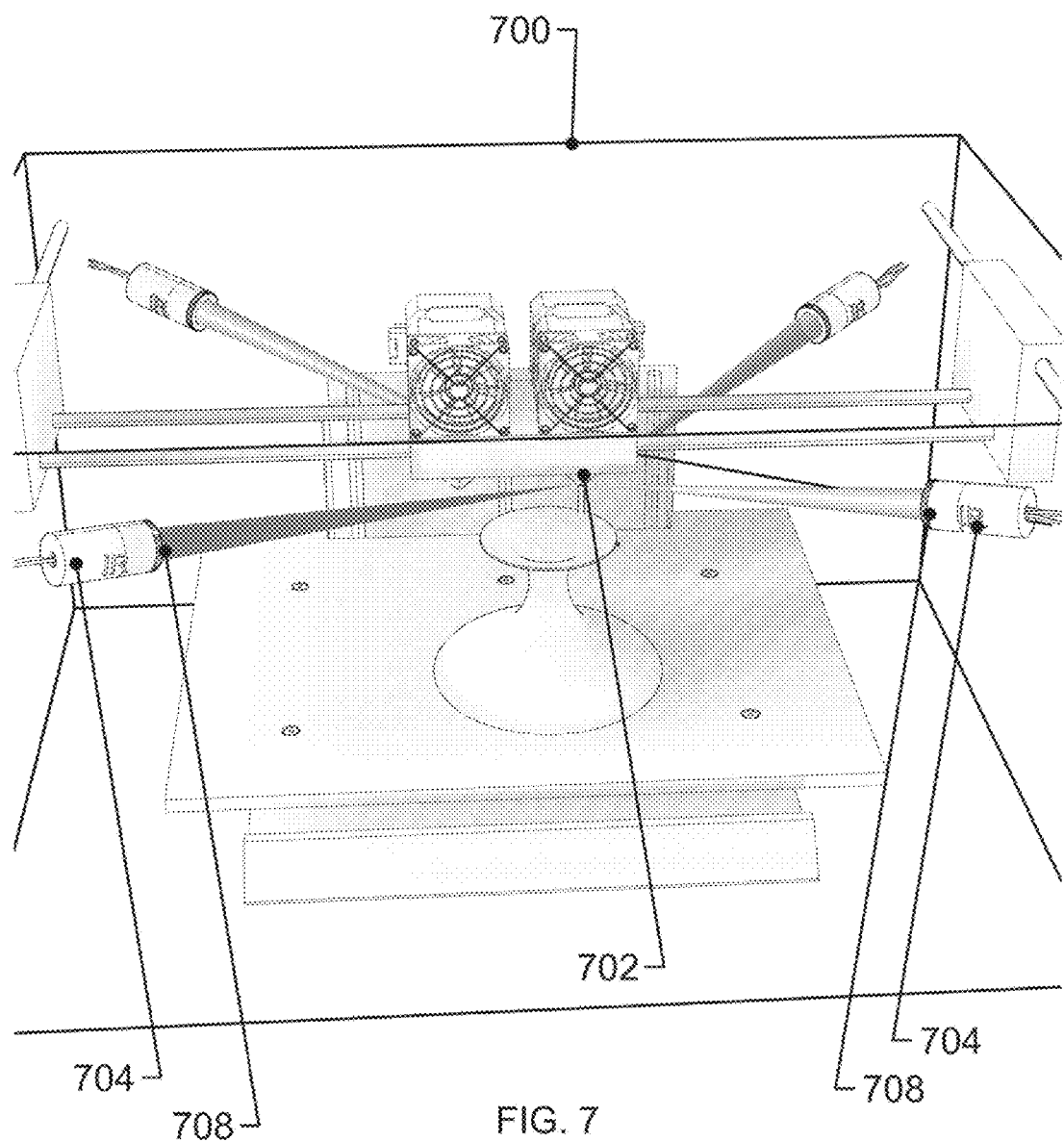
FIG. 7 illustrates an additive manufacturing apparatus whereby focusing elements are used to focus electromagnetic waves onto a constituent material as it is extruded in accordance with an embodiment of the invention.

Although FIG. 5 depicts that the subassemblies 504 are coupled to the nozzle head 502 and each subassembly 504 includes a source of electromagnetic radiation, in many embodiments, the electromagnetic wave source is decoupled from the nozzle head; instead, the electromagnetic waves are delivered to the constituent material using any of a variety of suitable techniques. For example, in many embodiments, fiberoptic cables are used to deliver electromagnetic waves to the constituent material as it is extruded through the nozzle. FIG. 6 depicts an additive manufacturing apparatus that utilizes fiber optic cables to deliver electromagnetic waves to the constituent material as it is extruded through the nozzle. In particular, the additive manufacturing apparatus includes a nozzle 602 and a subassembly 604 that is used to expose the constituent material 606 that is extruded through the nozzle to electromagnetic radiation of a particular wavelength. Notably, the subassembly includes fiber optic cables 608 that transmit electromagnetic waves originating from a source (not shown) to the subassembly 604. In this way, the source of electromagnetic radiation is decoupled from the nozzle. Decoupling the electromagnetic radiation source from the nozzle head can confer a variety of benefits. For example, by decoupling the EM source, the nozzle head thereby requires less power to maneuver during the build up of an additively manufactured structure. This can yield substantial power savings. Moreover, by decoupling the electromagnetic radiation source from the additive manufacturing apparatus, a single electromagnetic radiation source can source multiple additive manufacturing apparatuses. Note that the use of fiber optics can allow the electromagnetic wave source to be separated from the body of the additive manufacturing apparatus by any suitable distance. For example, the electromagnetic wave source can be located in one part of a business complex, while the body of the additive manufacturing apparatus can be located at a different part of the business complex. While the use of fiber optics to transmit electromagnetic radiation waves is illustrated, EM waves can be transmitted using any suitable mechanism in accordance with embodiments of the invention. For example, in many embodiments, electromagnetic waves are transmitted over the air using any of a variety of focusing elements that direct the waves toward the constituent material as it is deposited through the nozzle. FIG. 7 depicts an additive manufacturing apparatus whereby electromagnetic wave sources are decoupled from the nozzle head, and focusing elements are used to deliver electromagnetic waves from the electromagnetic wave sources to the constituent material that is extruded through the nozzle. In particular, the additive manufacturing apparatus 700 includes infrared wavelength sources 704 that are decoupled from the nozzle 702. The additive manufacturing apparatus 700 further includes focusing elements 708 that are configured to project the infrared electromagnetic radiation waves to the constituent material 706 that is extruded through the nozzle. As before, the decoupling of the nozzle from the electromagnetic wave source allows the nozzle 702 to be more nimble, and can allow the additive manufacturing apparatus 700 to draw less power during operation.

While the above description has listed a variety of ways in which the material properties of a constituent material can be controllably manipulated, in many embodiments, the materials properties of the constituent material is varied in multiple ways as it is being deposited. Thus for example, in many embodiments, additive manufacturing apparatuses include a plurality of subassemblies, each of which being able to controllably manipulate select portions of the constituent material in a different way. For instance, in some embodiments, an additive manufacturing apparatus includes a first subassembly that is configured to controllably expose a constituent material to infrared electromagnetic radiation and thereby initiate a first material transformation, as well as a second subassembly that is configured to controllably expose the constituent material to ultraviolet electromagnetic radiation and thereby initiate a second, different, material transformation. Essentially, a first material property of the constituent material can be a function of exposure to infrared radiation, and a second material property of the constituent material can be a function of exposure to ultraviolet radiation. In this way, multiple material properties of the constituent material can be controllably tuned during the deposition process. In several embodiments, an additive manufacturing apparatus includes a single subassembly that can controllably manipulate deposited constituent material in each of a plurality of different ways. For instance, in some embodiments, an additive manufacturing apparatus includes a subassembly that can controllably expose a constituent material to infrared electromagnetic radiation to initiate a first material transformation, and can also controllably expose the constituent material to an ultraviolet radiation to initiate a second material transformation. As can be appreciated, the exposure of the constituent material to infrared radiation and to ultraviolet radiation need not be simultaneous. While, the above discussion has focused on using electromagnetic radiation to initiate material transformation, it should be clear that the constituent material can be transformed using any suitable technique in accordance with embodiments of the invention.

FIGS. 8A-8B illustrate an additive manufacturing apparatus that includes a plurality of subassemblies, each of which being configured to controllably tune a separate respective material property of the constituent material. In particular, FIG. 8A illustrates an additive manufacturing apparatus that includes a first subassembly 814 that is configured to apply a first technique to the constituent material, a second subassembly 816 that is configured to apply a second technique to the constituent material, and a third subassembly 818 configured to apply a third technique to the constituent material as it is extruded through the nozzle head 802. FIG. 8B depicts that the constituent material 806 includes aspects that are sensitive to the first technique 821 such that the application of the first technique augments a first material property of the constituent material; aspects that are sensitive to the second technique 822 such that the application of the second technique augments a second material property of the constituent material; and aspects that are sensitive to the third technique 823 such that the application of the third technique augments a third material property of the constituent material. Accordingly, each of the three material properties of the constituent material can be controllably tuned using the techniques that can be applied with the respective subassemblies 814, 816, and 818. For instance, the aspects of the constituent material 806 that are sensitive to the first technique 821 can be a pigment, the transparency of which is altered based on infrared radiation exposure; the aspects of the constituent material 806 that are sensitive to the second technique 822 can be a material that hardens as a function of exposure to ultraviolet radiation; and the aspects of the constituent material 806 that are sensitive to the third technique can be a material that magnetizes as a function of exposure to an applied magnetic field. Correspondingly, the first technique can comprise exposing the constituent material 806 to infrared radiation, the second technique can comprise exposing the constituent material 806 to ultraviolet radiation, and the third technique can comprise exposing the constituent material 806 to a magnetic field. In general, embodiments of the invention include constituent materials that comprise a plurality of aspects that are each differently sensitive to any of a variety of applied techniques, e.g including, but not limited to, any of the above-described techniques. Thus, for example a single feedstock constituent material including a plurality of such aspects can be fed into a respective additive manufacturing apparatus, and be imbued with different, but customized, material properties during the buildup of a desired object. Of course, it should be appreciated that the constituent material can include any number of aspects that are differently sensitive to applied techniques; embodiments of the invention are not restricted to constituent materials having exactly three such aspects. It should also be appreciated that although FIGS. 8A-8B depict three subassemblies that each treat a respective aspect of the constituent material, in some embodiments, a single subassembly can apply different techniques to treat the individual aspects of the constituent material.

In many embodiments, a constituent material includes a plurality of aspects such that when the constituent material is uniformly subjected to a single treatment, at least two of the plurality of aspects of the constituent material respond differently to the treatment such that each of the at least two of the plurality of aspects develop different material properties. FIGS. 9A-9C depict a constituent material that comprises a plurality of different aspects, such that when the constituent material is subjected to a particular uniform treatment, each of the aspects respond differently such that they each develop different material properties. In particular, FIG. 9A depicts the cross section of a constituent material 906 that includes two aspects 921 and 922. FIG. 9A depicts that the constituent material 906 is being exposed to a treatment 916 that uniformly applied to its cross section. FIG. 9B depicts that the uniform treatment 916 has acted to eliminate the portion of the constituent material that was defined by the presence of the first aspect 921, and transmute the material properties of the second aspect 922. Of course, the uniform treatment 916 can impact the constituent material 906 in any of a variety of ways in accordance with embodiments of the invention. Thus, for example, FIG. 9C depicts that the uniform treatment 916 has acted to transmute the material properties of each of the aspects 921 and 922 in a different way.

Although FIG. 9 depicts aspects that are cylindrical in nature, it should be clear that the aspects within the constituent material can be of any suitable shape in accordance with embodiments of the invention. Indeed, as will be discussed later, the cross section of the constituent material can be of any suitable shape in accordance with embodiments of the invention. Thus, for example, FIGS. 10A-10C depict a constituent material that includes aspects defining a C-shape. FIGS. 10A-10C are similar to the illustrations seen in FIGS. 9A-9C, except that the constituent material 1006, includes first and second aspects 1021, 1022 that define a C-shape; as before, a uniform treatment 1016 is applied to the constituent material 1006.

Fabrication Strategies Incorporating Active Deposition

In many embodiments, additive manufacturing processes incorporate active deposition techniques are used to fabricate structures that include varied material properties. For example, as alluded to above, a constituent material may be sensitive to particular wavelengths of electromagnetic radiation insofar as the electromagnetic radiation exposure can controllably tune the constituent material's mechanical properties.

FIGS. 11A-11C depict how active deposition techniques can be used to dictate the mechanical properties of an additively manufactured structure. In particular, FIG. 11A illustrates that when a constituent material 1106 is exposed to infrared radiation from an infrared radiation source 1114, the resulting structure 1108 has demonstrable pliability. FIG. 11B illustrates that when the constituent material 1106 is exposed to ultraviolet radiation from an ultraviolet radiation source 1116, the resulting structure 1128, has demonstrable rigidity. In essence, exposure to infrared radiation causes the constituent material 1106 to develop pliability, while exposure to ultraviolet radiation causes the constituent material to develop rigidity. Accordingly, these mechanical properties of the constituent material 1106 may be controllably tuned while the constituent material 1106 is being deposited.

Thus, FIG. 11C illustrates that the constituent material 1106 of the base of the additively manufactured structure 1138 has been treated with ultraviolet radiation from an ultraviolet radiation source 1116, while the upper portion of the additively manufactured structure 1138 has been treated with infrared radiation from an infrared radiation source 1114. Accordingly, the base of the additively manufactured structure 1138 is developed to have notable structural rigidity, whereas the upper portion of the additively manufactured structure 1138 is developed to have notable pliability.

Figure 12:
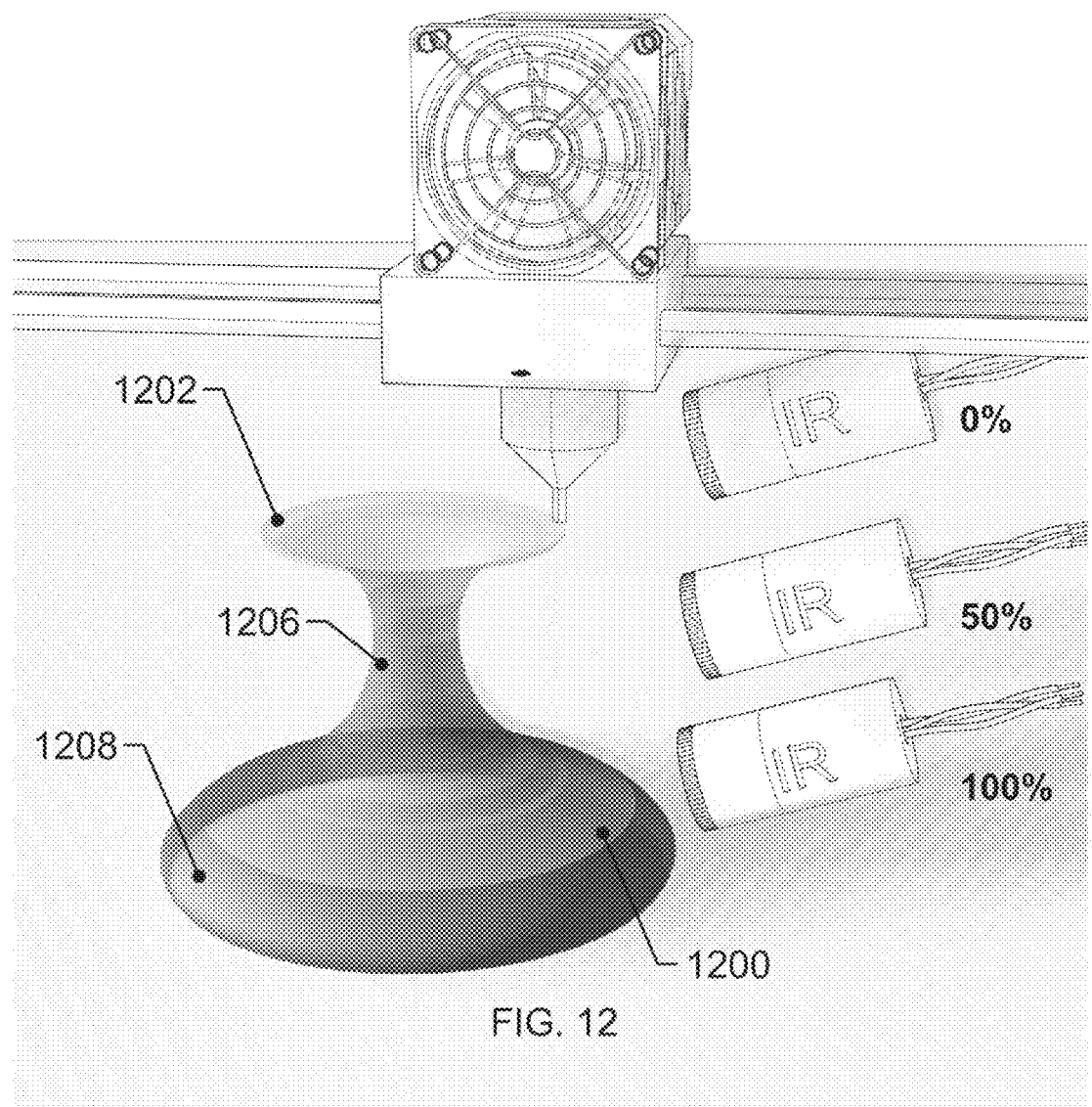
FIG. 12 illustrates a vase that includes varying levels of translucency that has been fabricated using additive manufacturing techniques in accordance with an embodiment of the invention.

Of course, while the tuning of the mechanical properties has been discussed and illustrated, it should be clear that any of the constituent material properties can be modified in accordance with embodiments of the invention using any of a variety of treatments. For example, FIG. 12 depicts an additively manufactured vase having varied translucence in accordance with embodiments of the invention. In particular, it is illustrated that the vase 1200 is transparent in its upper portion 1202, semi-transparent in its middle portion 1206, and not transparent at its base 1208. The vase 1200 was fabricated from a constituent material that included a pigment that is sensitive to infrared radiation such that the transparency of the constituent material is a function of its exposure to infrared radiation. Thus, during the additive manufacture of the vase, the different levels were exposed to different levels of infrared radiation to controllably determine the level of transparency, e.g. where greater transparency was desired, the constituent material was subjected less infrared radiation and vice versa.

Figure 13:
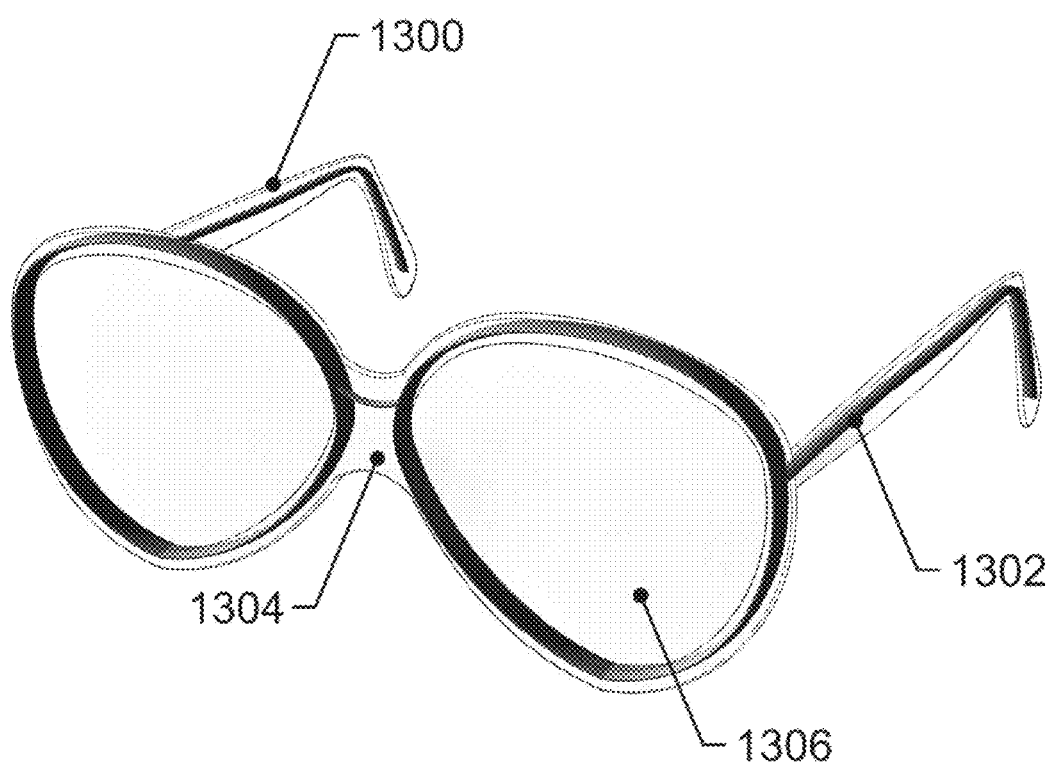
FIG. 13 illustrates a pair of glasses that includes constituent material having varying material properties that has been fabricated using additive manufacturing techniques in accordance with an embodiment of the invention.

For example, FIG. 13 depicts a pair of glasses that can be fabricated using additive manufacturing processes that incorporate active deposition in accordance with embodiments of the invention. In particular, the pair of glasses 1300 defines three portions: the skeleton of the frame 1304, the surface of the frame 1306, and the lenses 1308. The constituent material is sensitive to ultraviolet radiation as well as infrared radiation. In particular, exposure to ultraviolet radiation causes the constituent material to develop hardness while exposure to infrared radiation causes the material to lose its translucency. Thus, when constituent material was deposited to form the portions of the surface of the frame 1304, the constituent material was subjected to infrared radiation and not subjected to UV radiation so that the surface of the frame 1304 became soft and non-transparent. Conversely, when constituent material was deposited to form the lens, the constituent material was treated with 100% UV radiation and 0% infrared radiation so that the deposited constituent material became hard and transparent. When constituent material is deposited to form the skeleton of the frame 1302, the constituent material was treated with UV radiation at 100% so that the skeleton of the frame 1302 is developed to be hard. The translucency of the skeleton of the frame 1302 does not impact the operation of the glasses, so it can be exposed to any level of infrared radiation. While several examples of structure having varied material properties are illustrated, it should be emphasized that examples discussed are meant to be illustrative and not exhaustive. Any of a variety of material properties can be tuned during the deposition of the constituent material in an additive manufacturing process in accordance with embodiments of the invention. More generally, it should be understood that the above-mentioned concepts are meant to be versatile; thus, for example, any combination and any permutation of the above-described techniques can be implemented in accordance with embodiments of the invention. The above-described concepts are meant to be illustrative and not exhaustive. Additionally, it should also be appreciated that while the above-descriptions have regarded additive manufacturing apparatuses that include subassemblies that work in conjunction with the nozzle head, in many embodiments, the subassemblies can operate independently of the nozzle-head. For example, the subassemblies can be controlled to treat already deposited constituent material. The subassemblies may be used in this manner to refine the material properties of already deposited constituent material in accordance with embodiments of the invention.

While the above illustrations and discussions have suggested the transformation of the bulk inherent material properties of the constituent material, in many embodiments, the material properties are manipulated insofar as the cross-section of the extruded constituent material is manipulated. These aspects are now discussed in greater detail below.

Manipulating the Cross-Section of the Deposited Constituent Material

In many embodiments, the constituent material is manipulated insofar as its cross section as it is being deposited onto a surface in accordance with a deposition process is manipulated. The cross section of the material can be manipulated in any suitable way in accordance with embodiments of the invention. For example, the deposited constituent material can include a first component material and a second component material that are intertwined while the aggregate constituent material is being deposited.

Figure 14:
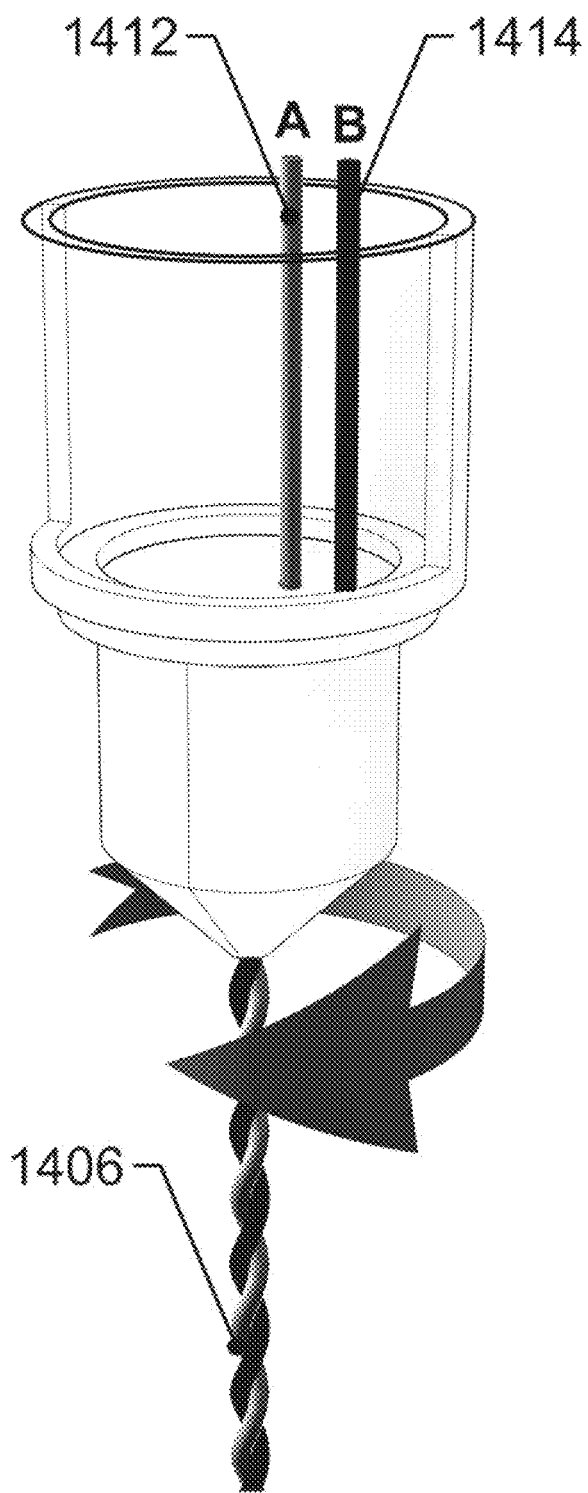
FIG. 14 illustrates rotating a pair of component materials as they are extruded from respective channels to form a constituent material in accordance with embodiments of the invention.
Figure 15A:
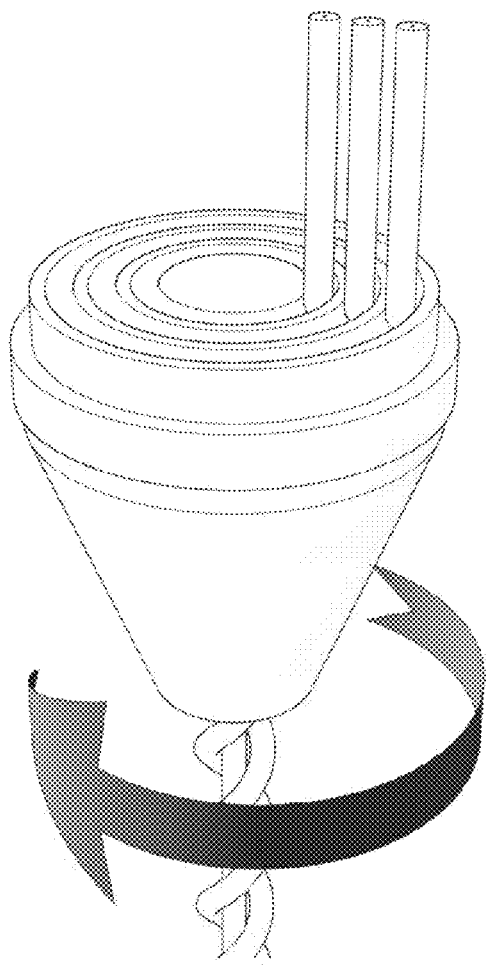
FIGS. 15A-15B illustrate rotating three component materials that are extruded from three respective channels to form a constituent material in accordance with embodiments of the invention.
Figure 15B:
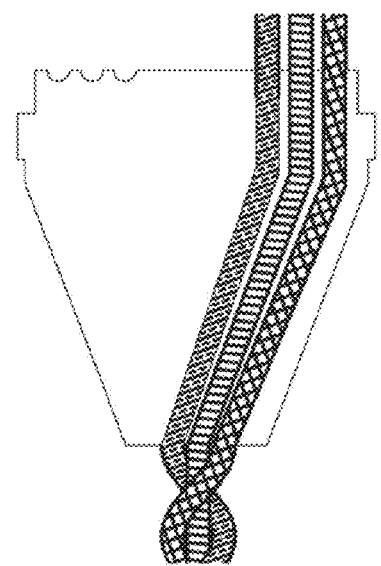

FIG. 14 depicts that a constituent material 1406 is manipulated by intertwining a first component material 1412 with a second component material 1414 while the constituent material 1406 is being deposited in accordance with embodiments of the invention. Although a constituent material 1406 having two component materials 1412, 1414 is depicted, it should be clear that a constituent material having any number of component materials can be deposited in accordance with embodiments of the invention. For example, FIGS. 15A-15B depict that a constituent material is manipulated by intertwining first, second, and third component materials while the constituent material is being deposited. The constituent material can be an aggregate of any number of component materials in accordance with embodiments of the invention.

Figure 16A:
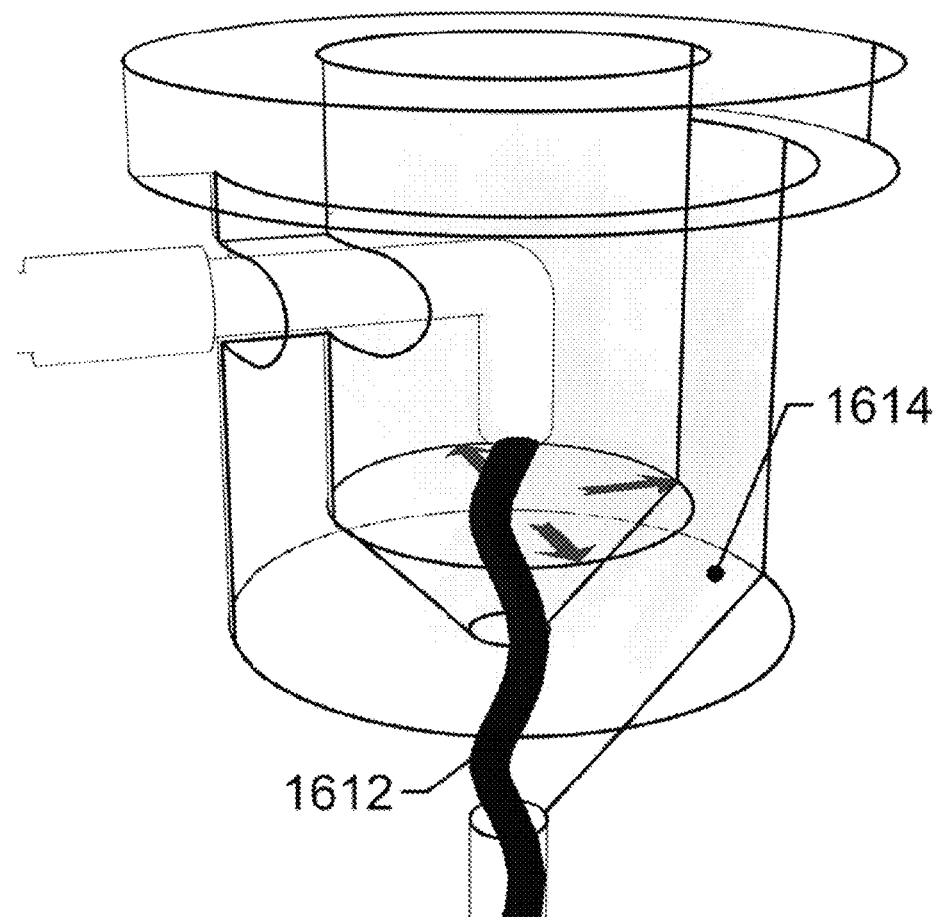
FIGS. 16A-16B illustrate manipulating the extrusion of a first component material within a second component material to form a constituent material in accordance with embodiments of the invention.
Figure 16B:
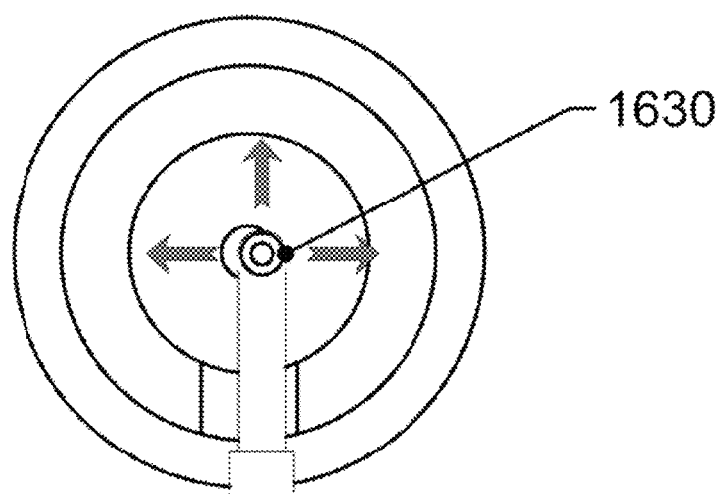

The cross section of the deposited constituent material can be altered in any suitable way in accordance with embodiments of the invention, and is not just limited to intertwining component materials. For example, in some embodiments, the first component material is enveloped by the second component material. In many embodiments, the spatial relationship between a first component material and a second component material can be controllably varied in any suitable way. FIGS. 16A-16B depict how a constituent material includes a first component material disposed within a second component material, where the location of the first component material within the second component material can be controllably varied. In particular, FIG. 16A depicts that the first component 1612 material defines a spiraling path within a second component material 1614. This can be achieved for example by rotating the first component material 1612 within the second component material 1614 in a circular path while the aggregate is being deposited onto a surface. A controllable channel can be used to cause this outcome. For example, FIG. 16B depicts a controllable channel 1630 that emits the first component material 1612 within the second component material 1614. The relative location of the channel 1630 within the second component material 1614 can be controlled that the emission of the first component material within the second component material can be controlled; in this way the constitution of the cross section of the constituent material can be controlled.

These techniques can be advantageous in the additive manufacture of any of a variety of structures in accordance with embodiments of the invention. For example, in some embodiments, a wire is additively manufactured whereby the first component material is conductive, and the second conductive material is insulating. Accordingly, the cross section of the constituent material defines the cross section of the wire; where it is desired that the wire include an exposed lead, the channel responsible for emitting the conductive first component material can be controlled to move to the periphery for the constituent material such that the first conductive component material is exposed. Of course, it should be understood that the above described techniques are not limited to the fabrication of wires; indeed, in many embodiments, these techniques are used to fabricate any of a variety of structures.

The cross section of the constituent material can be transformed in any suitable way in accordance with embodiments of the invention, and is not limited to varying the spatial relationship of component materials within the constituent material. For example, as alluded to above, in some embodiments, the deposited constituent material is coated with a colored material prior to deposition—in this way, the cross section of the constituent material is being manipulated insofar as a thin layer of colored coating is being applied to the constituent material. Indeed, the cross section of the component material can be modified in any suitable way in accordance with embodiments of the invention. In a number of embodiments, the geometry of the cross section is transformed, and this aspect is now discussed below in further detail.

Figure 17A:
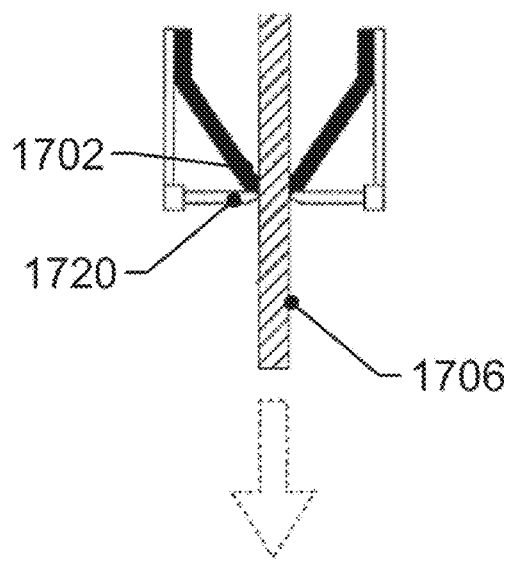
FIGS. 17A-17B illustrates controlling a shutter for manipulating the aperture of the nozzle as it deposits material in accordance with an embodiment of the invention.
Figure 17B:
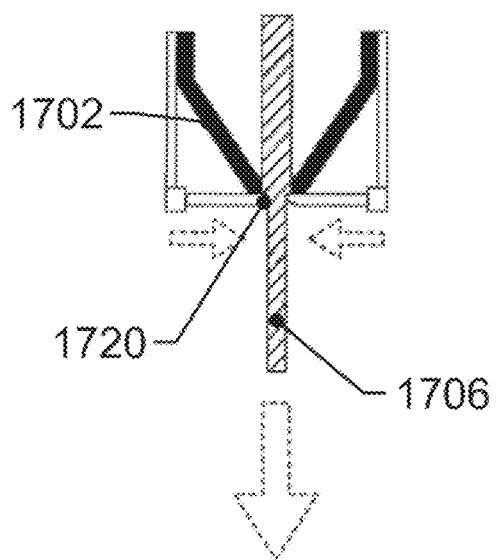
Figure 18A:
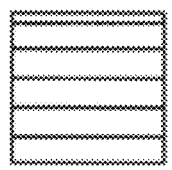
FIGS. 18A-18F illustrate different cross-sections that can be obtained by manipulating the nozzle aperture in accordance with embodiments of the invention.
Figure 18B:
Figure 18C:
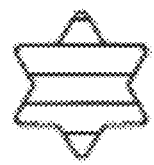
Figure 18D:
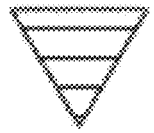
Figure 18E:
Figure 18F:
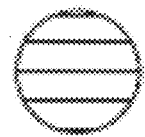

Manipulating the Geometry of the Cross Section of the Constituent Material in Accordance with Embodiments of the Invention In many embodiments, the geometry of the cross section of the constituent material is controllably manipulated during the deposition process. The geometry can be varied in any number of ways using any of a variety of techniques. For example, in some embodiments, a shutter mechanism is adjoined to the nozzle to vary the geometry of the extruded constituent material; the shutter mechanism can controllably manipulate the geometry of the extruded constituent material. FIGS. 17A-17B depict the operation of a shutter assembly in accordance with embodiments of the invention. In particular, FIG. 17A depicts that the shutter assembly 1720 is adjoined to the nozzle 1702 and is in a first non-activated position, where the constituent material 1706 is extruded into a base geometry, while FIG. 17B depicts that the shutter assembly 1720 is in an activated position, where the geometry of the cross section is in a second controlled position. Accordingly, any of a variety of cross sections can be defined. For example, FIGS. 18A-18F depict a number of cross sections of deposited constituent material that can be defined using shutter assemblies in accordance with embodiments of the invention. In particular: FIG. 18A depicts that a square cross section can be defined; FIG. 18B depicts that an augmented triangular cross section can be defined; FIG. 18C depicts that a six-pointed star can be defined; FIG. 18D depicts that a triangular cross section can be defined; FIG. 18E depicts that a trapezoid can be defined; and FIG. 18F depicts that a circular cross section can be defined. While several illustrative cross sections are illustrated and discussed, it should be clear that any of a variety of cross section geometries can be implemented in accordance with embodiments of the invention.

While the above discussion has regarded manipulating the cross-section of the deposited constituent material prior to extrusion, the constituent material can be manipulated prior to extrusion using any of a variety of methods in accordance with embodiments of the invention. For example, in some embodiments, the nozzle head is fabricated from a material that is transparent to certain electromagnetic wavelengths, e.g. infrared radiation; simultaneously, the constituent material may be sensitive to infrared radiation exposure. Thus, prior to extruding the constituent material, the nozzle head may be exposed to infrared radiation; because it is transparent to infrared radiation, the material properties of the constituent material that is within the nozzle head can be transmuted by the infrared radiation exposure. In this way, the initiation of the transformation of the material properties of the constituent material can begin prior to the extrusion. Of course, it should be appreciated that although the above example is discussed in connection with infrared radiation, any suitable electromagnetic wavelength range may be implemented. More generally, while several examples of manipulating the material properties of constituent material are given, it should be understood that the material properties of a constituent material can be manipulated prior to extrusion in any suitable way in accordance with embodiments of the invention. The discussed examples are meant to be illustrative and not exhaustive.

In general, as can be inferred from the above discussion, the above-mentioned concepts can be implemented in a variety of arrangements in accordance with embodiments of the invention. Accordingly, although the present invention has been described in certain specific aspects, many additional modifications and variations would be apparent to those skilled in the art. It is therefore to be understood that the present invention may be practiced otherwise than specifically described. Thus, embodiments of the present invention should be considered in all respects as illustrative and not restrictive.

What is claimed is:

1. A method of fabricating an object comprising:
    progressively depositing constituent material onto a surface to form the shape of the object to be fabricated in accordance with an additive manufacturing process; and
    manipulating the material properties of at least some portion of the constituent material that is deposited onto a surface such that at least some portion of the deposited constituent material possesses different material properties than at least some other portion of the deposited constituent material;
    wherein manipulating the material properties of the at least some portion of the constituent material begins prior to, or concurrently with, its deposition onto a surface.

2. The method of claim 1 wherein:
    progressively depositing the constituent material onto a surface comprises extruding the constituent material through a nozzle; and
    manipulating the material properties of the at least some portion of the constituent material begins after the at least some portion of the constituent material is extruded through the nozzle.

3. The method of claim 2, wherein manipulating the material properties of the at least some portion of the constituent material comprises one of: subjecting the at least some portion of the constituent material to electromagnetic waves; magnetizing the at least some portion of the constituent material; subjecting the at least some portion of the constituent material to a gas; vibrating the at least some portion of the constituent material; and heating the at least some portion of the constituent material.

4. The method of claim 3, wherein manipulating the material properties of the at least some portion of the constituent material comprises subjecting the at least some portion of the constituent material to electromagnetic waves.

5. The method of claim 4, wherein subjecting the at least some portion of the constituent material to electromagnetic waves comprises using fiber optic cables to transmit the electromagnetic waves from a wave source to the at least some portion of the constituent material.

6. The method of claim 4, wherein subjecting the at least some portion of the constituent material to electromagnetic waves comprises using optics to focus the electromagnetic waves onto the at least some portion of the constituent material.

7. The method of claim 1, further comprising manipulating the material properties of at least some portion of the constituent material that is deposited onto a surface in at least another way.

8. The method of claim 1, wherein:
    the constituent material comprises at least two component materials; and
    manipulating the material properties of the at least some portion of the constituent material comprises manipulating the composition of the cross-section of the constituent material that is deposited onto a surface.

9. The method of claim 8, wherein:
    manipulating the composition of the cross-section of the constituent material that is deposited onto a surface comprises varying the aggregation of a first component material and at least a second component material.

10. The method of claim 9, wherein varying the aggregation of a first component material and at least a second component material comprises intertwining the first component material and at least the second component material as the constituent material is being deposited onto a surface.

11. The method of claim 1, wherein manipulating the material properties of the at least some portion of the constituent material comprises varying the cross-section of the constituent material that is deposited.

* * * * *